length A-C, the tubular member 2 may be severed transversely to its length at the point C to thereby afford a finished heat exchanger element having fins 4 spaced along substantially the full length thereof. As will be appreciated by those skilled in the art, if desired, the formation of the fins 4 may be commenced inwardly of the end portion A of the tubular member 2, and the tubular member may be severed outwardly to the left, as viewed in FIG. 1, of the last formed fin 4 to thereby afford end portions which project outwardly from the outermost fins 4 to afford connecting members at each end of the finished heat exchanger. In such last mentioned construction, not shown, the ribs 13 of the tubular member 2 disposed outwardly of the aforementioned outermost fins, preferably are removed by suitable means, such as, for example, grinding, to thereby afford a smooth-walled end portion for the completed heat exchanger.

The method of making finned heat exchangers, thus far described herein, by cutting or gouging them from the opposite sides of a tubular member, has been heretofore known in the art, being shown, for example, in the previously mentioned patents and in the previously mentioned co-pending patent applications.

It will be remembered that it has been heretofore known that when fins are made in the aformentioned manner, by cutting or gouging them from opposite sides of a smooth-walled tubular member, the faces of the fins of such heretofore known heat exchangers, corresponding to the sides or faces 20 of the fins 4, which face to the right, as viewed in FIG. 1, in the direction of the cutting movement of the cutters, such as the cutter 14, only, are roughened, while the faces of the fins, corresponding to the faces 21 of the fins 4, shown in FIG. 1, facing to the left are shiny smooth, as are the surfaces of the tubular member 2 from which these last mentioned faces are lifted. It will be remembered that one of the major purposes of the present invention is to increase the roughness of the faces 20 of the fins 4 over that of the corresponding faces of fins heretofore known in the art, to thereby afford the previously mentioned advantageous performances of the fins 4.

In accordance with the principles of the preferred form of my present invention, the increased roughening of the faces or sides 20 of the fins 4 is accomplished by forming perforations in the surfaces 16 and 19 of the tubular member 2, from which each fin 4 is cut or gouged, just prior to the formation of the respective fin 4.

In FIGS. 1-2 of the drawings, apparatus, which is suitable for the practice of the preferred form of my invention is fragmentarily shown in operable position relative to the upper side of the tubular member 2, to illustrate a manner in which the invention may be practiced. As will be appreciated by those skilled in the art, although such apparatus is shown in operation only on the upper side of the tubular member 2, it is to be understood that similar apparatus would be simultaneously used on the underside of the tubular member 2, in forming a heat exchanger, such as the heat exchanger 1, shown in the drawings, wherein the fins 4 are formed both on the top and the bottom of a tubular member, the showing of only one such apparatus being sufficient for disclosure of the practice of the method with which we are herein concerned.

The apparatus 22, fragmentarily shown in FIGS. 1 and 2, may be of any suitable type, but, preferably, is of the general type shown in my aforementioned co-pending U.S. patent applications Ser. Nos. 198,458 and 204,210, and embodies an elongated, substantially rectangular-shaped cutter slide 23 slidably mounted in the bottom portion of a substantially inverted U-shaped stationarily mounted cutter guide 24. The slide 23 and the guide 24 preferably are of the same type, and operate in the same manner as the slide and guide shown in my aforementioned co-pending U.S. patent application Ser. No. 198,458, except that the guide 24 has a tongue 25 projecting forwardly from the upper portion thereof in overlying relation to the path of reciprocation of the front end of the slide 23, and the slide 23 has a cam surface 26 on the upper, front end portion thereof for a purpose which will be discussed in greater detail presently.

As in the apparatus shown in the aforementioned co-pending U.S. patent applications Ser. Nos. 198,458 and 204,210, the slide 23 is slidably mounted in the guide 24 by pins 27 mounted in the guide 24 and operatively engaged in elongated slots disposed on opposite sides of the slide 23, in the manner of the slot 28 shown in FIGS. 1 and 2, the slide 23 being movable, during operation of the apparatus 22, from a fully retracted position, as shown in FIG. 1, to a fully extended position, as shown in FIG. 2, by any suitable mechanism, not shown, such as the mechanism shown in the aforementioned co-pending patent applications.

The apparatus 22 also embodies an elongated, substantially L-shaped lever arm 29 disposed in underlying relation to the tongue 25, with the free end of the longer leg 30 thereof pivotally mounted to the guide 24 by suitable means such as a pin 31, and with the free end of the shorter leg 32 of the lever arm 29 facing toward the tubular member 2. The lever arm 29 forms the base portion of a marker mechanism 33, which includes a marking tool 34, mounted on the free end portion of the leg 32, and a compression spring 35 disposed in operative position between the tongue 25 and the upper portion of the leg 30 of the lever arm 29 in position to yieldingly urge the lever 29 to pivot downwardly around the pin 31, in a clockwise direction, as viewed in FIGS. 1 and 2, toward the tubular member 2.

The marker tool 34 is disposed in underlying relation to the lower face of the free end of the shorter leg 32 of the lever arm 29 and has a plurality of perforating members 35, FIGS. 1, 2 and 2A, which preferably are conical in shape projecting downwardly from the lower face thereof with the points of the cone-shaped members 35 projecting in an outward direction.

The lever arm 29 has a cam surface 36 on the lower face of the longer leg 30 thereof, and is of such size and is so disposed on the guide 24 that the surface 26 on the lever arm 29 rides along the surface 36 of the slide 23, under the urging of the compression spring 35, during the reciprocation of the slide 23 between the fully retracted position, shown in FIG. 1, and the fully extended position shown in FIG. 2, to thereby cause the lever arm 29 to oscillate around the pin 31 between the fully lowered position, shown in FIG. 1 and the fully raised position, shown in FIG. 2. When the lever arm 29 is disposed in the fully lowered position shown in FIG. 1, the pins 35 are effective to perforate the portions of the tube 2 underlying the surfaces 16 and 19 into the base 18, underlying the ribs 13, but not to a depth sufficient to perforate the tubular member 2. For example, with a tubular member 2 having a wall thickness of 0.035", and with the depth of cut being 0.003", it is preferred that the length of the pins 35 be such that the

METHOD FOR FORMING A HEADLESS RESISTOR UTILIZING SELECTIVE DIFFUSION AND SPECIAL CONTACT FORMATION

This is a continuation, of application Ser. No. 71,804, filed Sept. 4, 1979 now abandoned, which application is a divisional of a prior application Ser. No. 914,637 filed June 12, 1978 (now U.S. Pat. No. 4,191,964) which application was a continuation of prior application Ser. No. 760,593 filed Jan. 19, 1977, now abandoned.

This invention relates to resistors in planar semiconductor technology and, more particularly, to a planar resistor in a Schottky device and having contact areas which are coincident with the shape of the resistor.

The gold doped TTL (transistor-transistor logic) process is an industry standard process which has been used to produce a wide range of products including arithmetic logic units, counters, memories, drivers, buffers and multiplexers and numerous other SSI (small-scale integration) products. Characteristically, in the gold doped TTL process metal is deposited at temperatures greater than 550° C. and the resistivity of epitaxial layers is less than 1 $\Omega$-cm. due to the temperature and epitaxial resistivity, the deposited metal forms an ohmic contact rather than a diode.

In order to form a diffused resistor in the surface of a semiconductor device produced by the gold doped TTL process, it would typically be necessary to diffuse or implant a p-type material into a n-type epitaxial layer. Formation of the contacts to the resistor would be made on the surface of the semiconductor material at either end of the region dedicated to the resistor. Since metal makes an ohmic contact to the epitaxial layer, the metal deposited at either end of the resistor region to contact the resistor region could not be allowed to touch the epitaxial layer. If the metal contacted physically the epitaxial layer then a short would occur between the resistor and supply voltage, $V_{CC}$, and circuit performance would be impaired. Such physical contact could occur if a contact mask were misaligned or if an oversized contact opening were inadvertently formed by over-etching. In order to overcome this problem, buffer regions or "heads" were formed around the ends of the resistive regions. These "heads" surrounded the resistive regions at the point at which electrical contacts would be formed. The contacts could never overlap epitaxial regions and no short would occur. Such resistors are known to solve the shorting problem but result in larger areas of semiconductor material because the design rules for a given process allow components to be placed only at certain minimum distances from each other.

It is therefore an object of the present invention to provide a planar diffused resistor for a Schottky device which does not have a buffer region or "head" of highly doped conductivity surrounding the ends.

It is a further object of the present invention to provide a headless planar diffused resistor.

It is another object of the present invention to provide a planar diffused resistor on which the electrical contact regions are coincident with the shape of the resistor.

BRIEF DESCRIPTION OF THE DRAWINGS

For a more complete understanding of the headless diffused resistor of the present invention, reference may be made to the drawings which are incorporated by reference herein and in which.

SUMMARY OF THE INVENTION

In a TTL Schottky process characterized by metallization temperatures of less than 520° C. and epitaxial resistivities greater than 0.1 $\Omega$-cm, diffused resistors are provided with ends which do not have heavily doped regions surrounding contact areas. Shorts do not occur even if contacts are misaligned or if contact openings are oversized due to excessive exposure of the contact mask. Schottky diodes are formed in such instances instead of metal-to-epitaxy shorts.

BRIEF DESCRIPTION OF THE PREFERRED EMBODIMENT

Schottky processes are increasingly used to produce products such as memories, microprocessor circuits and various MSI (medium-scale integration) and SSI (small-scale integration) functions. This process is preferred primarily because of higher speed-power products and packing densities. In such processes in order to achieve high-level integration it is desired to produce diffused resistors. Such resistors are universally produced in epitaxial layers since the use of a bulk substrate for fabrication of active devices would require a triple diffusion. The triple diffusion would produce too high a surface impurity concentration to permit fabrication of Schottky devices. Thus, the double diffusion into a predoped epitaxial layer is employed.

The prior-art technique for production of diffused planar resistors in standard production processes including the gold doped TTL process was to provide highly doped contact regions in the semiconductor material surrounding the ends of the resistors so that misaligned or over-etched contact openings will not result in metal-to-epitaxy shorts. However, it has been found that for the special metal schemes and temperature characteristic of Schottky processes shorts do not occur but, instead, Schottky diodes are formed. The present invention in which headless diffused resistors are produced results from this discovery.

Figure 1:
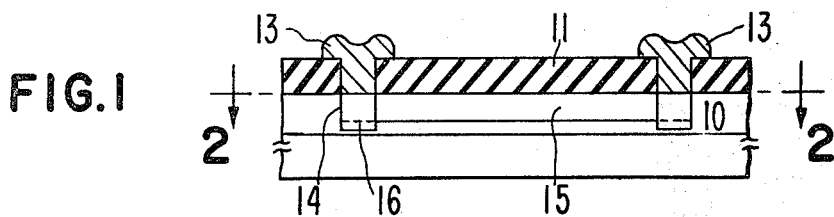
FIG. 1 is a cross-sectional view of the headless resistor of the present invention.
Figure 2:
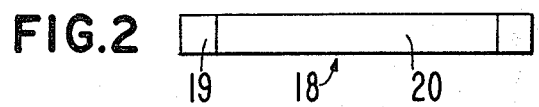
FIG. 2 is a plan view of FIG. 1 taken through lines 2—2.

FIGS. 1 and 2 illustrate the presently preferred embodiment of the diffused headless resistor of the present invention. A diffused region 15 has been formed in epitaxial layer 10. It extends into the contact diffusion 14 as shown by the horizontal dotted line. The impurity concentration will be determined by the optimum process. the configuration of region 15 will be determined by the resistance desired. Ohmic contact to region 15 is made by forming an opening in insulation layer 11, typically composed of silicon dioxide, and performing a contact diffusion which typically extends to the bottom of the resistor diffusion or below it as shown by region 16. This contact diffusion is frequently performed by the same step as the base diffusion of vertical bipolar transistors. This contact diffusion is not performed to offset resistance since the size of the resistor will determine the ultimate resistance but rather to provide a good medium for adherence of a metal contact since the presence of impurity atoms tends to produce a better bond.

Plugs of metal or polycrystalline silicon 13 are then deposited through windows opened in silicon dioxide 11 to connect diffused region 15 with other parts of the integrated circuit. In one example the resistor diffusion region 15 has a sheet resistance on the order of 1,000 $\Omega$/square and the contact diffusion has a resistance on the order of 400 $\Omega$/square. If the metal plugs 13 should contact substrate or epitaxial layer 10 there will be no short because a Schottky diode is formed between metal and epitaxy and it is reverse-biased since the epitaxy surrounding resistor diffusion is invariably tied to the highest potential in the circuit, i.e., to the supply line.

Figure 5:
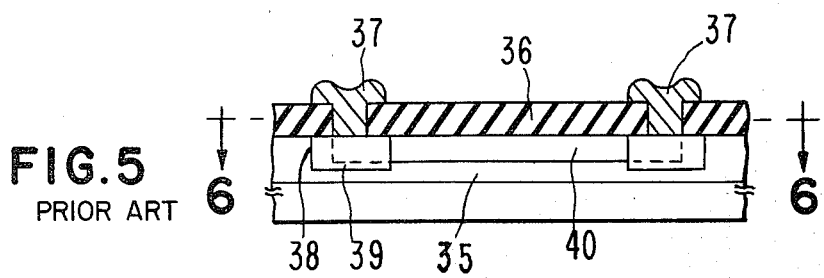
FIG. 5 is a cross-sectional view of a prior-art diffused planar resistor.
Figure 6:
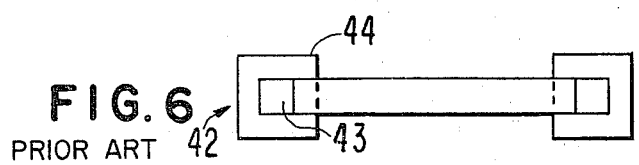
FIG. 6 is a plan view of the prior-art resistor of FIG. 5 taken through line 6—6.

A prior-art structure for non-Schottky devices is shown in FIGS. 5 and 6. the contact diffusion 38 (FIG. 5) has been expanded to a perimeter 44 (FIG. 6) so that the metal plug 37 will never touch the substrate or epitaxial layer 35. The contact area 43 is so completely surrounded by contact diffusion 38 that a metal-to-epitaxy contact would not likely occur. If it did occur a short would result because the resistivity of the epitaxial layer is lower than with Schottky processes and the temperature at which metal is applied is greater.

Figure 3:
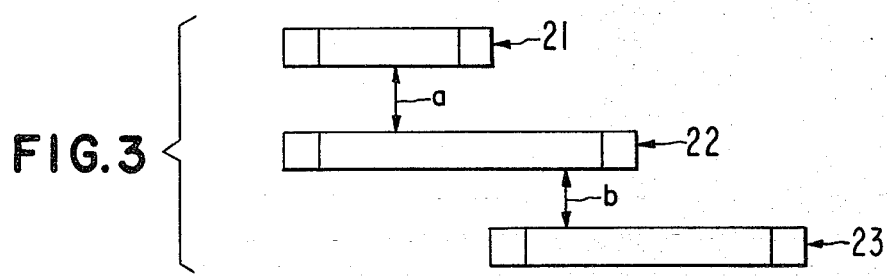
FIG. 3 is a plan view of a diffused resistor layout utilizing the headless resistors of FIG. 1.
Figure 4:
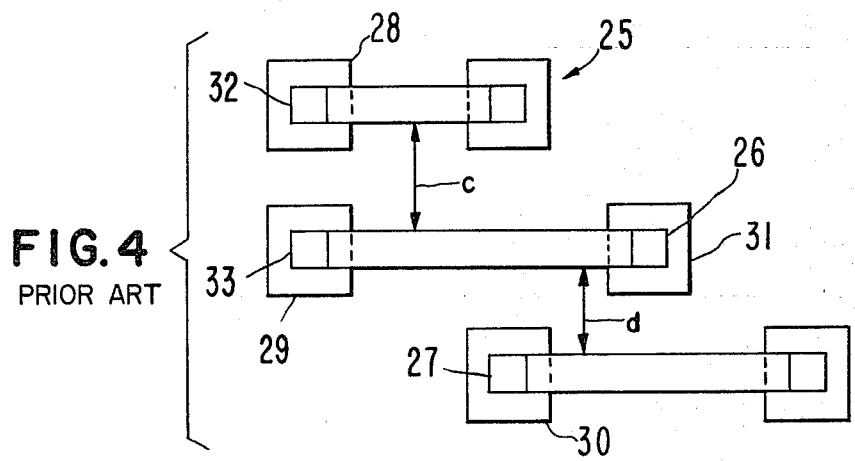
FIG. 4 is a plan view of a resistor layout using prior-art diffused resistors.

The utility of the headless resistor can clearly be seen by comparing the layout of FIG. 3 with that of FIG. 4. Design rules for any process will specify the minimum distance between adjacent components. These minimum distances are determined by mask alignment tolerance, etching tolerances, worst case depletion layer widths and channelling problems. With no "heads" to be concerned about, a circuit designer can place resistors in parallel with each other or with other active device regions at the minimum distance; in FIG. 3, then, spacings a and b can be minimum distance. However, when resistor heads are used the heads themselves must not be allowed to come closer than the minimum allowable distance to any other region. Thus, spacing c in FIG. 4 is this minimum allowable design distance plus twice the distance that the perimeter of heads 28 and 29 extend beyond the respective metal contact openings 32 and 33. And spacing d is this minimum allowance design distance plus the greater of the distances that the perimeters of heads 31 and 30 extend beyond the respective metal contact openings 26 and 27. Component layout can be more dense without resistor heads.

While the invention has been described in connection with specific embodiments thereof, it will be understood that it is capable of further modification, and this application is intended to cover any variations, uses or adaptations of the invention following, in general, the principles of the invention and including such departures from the present disclosure as come within known or customary practice in the art to which the invention pertains and as may be applied to the essential features hereinbefore set forth, and as fall within the scope of the invention and the limits of the appended claims.

I claim:

1. A method for forming a resistor in a semiconductor body, said semiconductor body having an impurity concentration of less than $10^{17}$ ohms per cubic centimeter and said semiconductor body including a resistor diffusion formed adjacent a surface of said body on which an overlying insulator has been formed, said process comprising:

removing first and second non-adjacent portions of said insulation over said resistor diffusion;

introducing an impurity through said openings in said insulating layer to thereby form two contact diffusions in portions of the resistor diffusion, said contact diffusions being substantially coincident with the shape of said resistor diffusion and adjacent said body of semiconductor material at the locations at which each of the contacts is made, said contact diffusion of such concentration to form an ohmic contact to a Schottky contact forming material; and forming ohmic contacts of a Schottky contact forming material for ohmically contacting each of said contact diffusions, said formation occuring at a temperature of less than 520° C., to thereby create a Schottky diode between any portion of said ohmic connections which is formed in contact with any portion of said semiconductor body.

2. A method for forming a resistor in a semiconductor body, said semiconductor body having a resistivity of greater than 0.1 ohm centimeter and said semiconductor body including a resistor diffusion formed adjacent a surface of said body on which an overlying insulating layer has been formed, said process comprising:

removing first and second non-adjacent portions of said insulating layer over said resistor diffusion to thereby form openings to the resistor diffusion;

introducing an impurity through said openings in said insulating layer to thereby form two contact diffusions in portions of the resistor diffusion, said contact diffusions being substantially coincident with the shape of said resistor diffusion and adjacent said semiconductor body at the locations at which each of the contacts is made, said contact diffusion of such concentration to form an ohmic contact to a Schottky contact forming material; and forming ohmic connections of a Schottky contact forming material for ohmically contact each of said contact diffusions, said formation occuring at a temperature of less than 520° C., to thereby create a Schottky diode between any portion of said ohmic connections which is formed in contact with any portion of said semiconductor body.

* * * * *